(12) United States Patent
Ito et al.

(10) Patent No.: US 10,886,220 B2
(45) Date of Patent: Jan. 5, 2021

(54) SEMICONDUCTOR INTEGRATED CIRCUIT DEVICE

(71) Applicant: Socionext Inc., Kanagawa (JP)

(72) Inventors: Chika Ito, Yokohama (JP); Isaya Sobue, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/555,890

(22) Filed: Aug. 29, 2019

(65) Prior Publication Data

US 2019/0385945 A1 Dec. 19, 2019

Related U.S. Application Data

(63) Continuation of application No. PCT/JP2018/005924, filed on Feb. 20, 2018.

(30) Foreign Application Priority Data

Mar. 29, 2017 (JP) .................................. 2017-064568

(51) Int. Cl.
*H01L 23/528* (2006.01)
*H01L 27/04* (2006.01)
(Continued)

(52) U.S. Cl.
CPC ........ *H01L 23/528* (2013.01); *H01L 27/0207* (2013.01); *H01L 27/04* (2013.01); *H03K 19/17744* (2013.01)

(58) Field of Classification Search
CPC ... H01L 23/528; H01L 27/04; H01L 27/0207; H01L 21/823475; H03K 19/17744; H03K 19/1776
See application file for complete search history.

(56) References Cited

U.S. PATENT DOCUMENTS 5,552,618 A * 9/1996 Taniguchi ......... H01L 27/11898
257/206
6,518,787 B1 * 2/2003 Allegrucci ....... H03K 19/17744
326/38
(Continued)

FOREIGN PATENT DOCUMENTS

JP    H04-267542 A    9/1992
JP    2006-196875 A   7/2006
(Continued)

OTHER PUBLICATIONS

International Search Report issued in corresponding International Patent Application No. PCT/JP2018/005924, dated May 15, 2018, with English translation.

*Primary Examiner* — Erik T. K. Peterson
*Assistant Examiner* — Pavel G Ivanov
(74) *Attorney, Agent, or Firm* — McDermott Will & Emery LLP

(57) ABSTRACT

For a semiconductor integrated circuit device in which IO cells are disposed, power supply voltage drop can be reduced using a multilayer interconnect. A power supply interconnect formed in a plurality of interconnect layers extends in an X direction that is a same direction as a direction in which the IO cells are aligned. In an area of a power supply IO cell, a power supply interconnect extending in a Y direction is disposed in one of the interconnect layers in which the power supply interconnect is not formed and an interconnect piece is disposed in a same position as a position of the power supply interconnect formed in an area of a signal IO cell in the Y direction at each of both ends of the area of the power supply IO cell in the X direction.

4 Claims, 9 Drawing Sheets

(51) Int. Cl.
  *H03K 19/17736*  (2020.01)
  *H01L 27/02*    (2006.01)

(56) References Cited

U.S. PATENT DOCUMENTS

| | | | |
|---|---|---|---|
| 2009/0072888 A1* | 3/2009 | Ogata | H03K 17/6872 |
| | | | 327/534 |
| 2009/0127721 A1* | 5/2009 | Isono | H01L 27/0203 |
| | | | 257/786 |
| 2012/0179893 A1* | 7/2012 | Mishra | H01L 23/5286 |
| | | | 712/11 |

FOREIGN PATENT DOCUMENTS

| | | |
|---|---|---|
| JP | 2009-26868 A | 2/2009 |
| WO | 2006/103897 A1 | 10/2006 |

* cited by examiner

FIG. 3A NTH LAYER
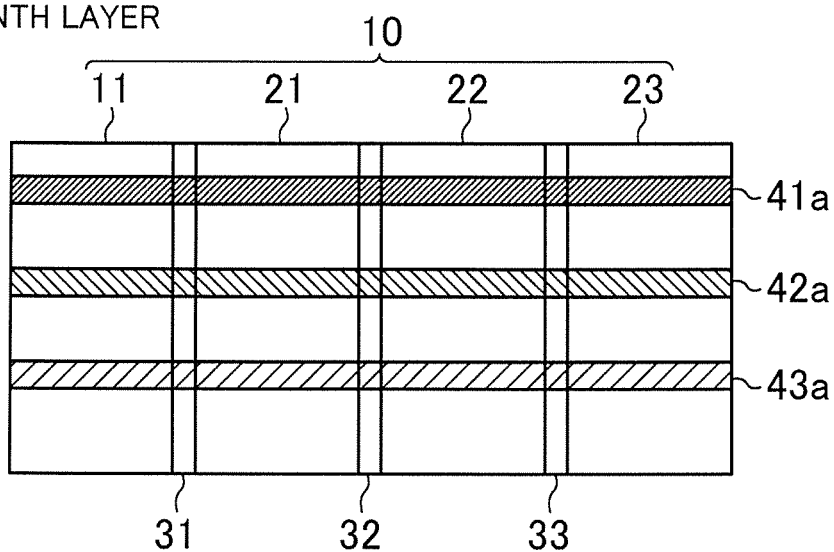
FIG. 3B (N+1)TH LAYER
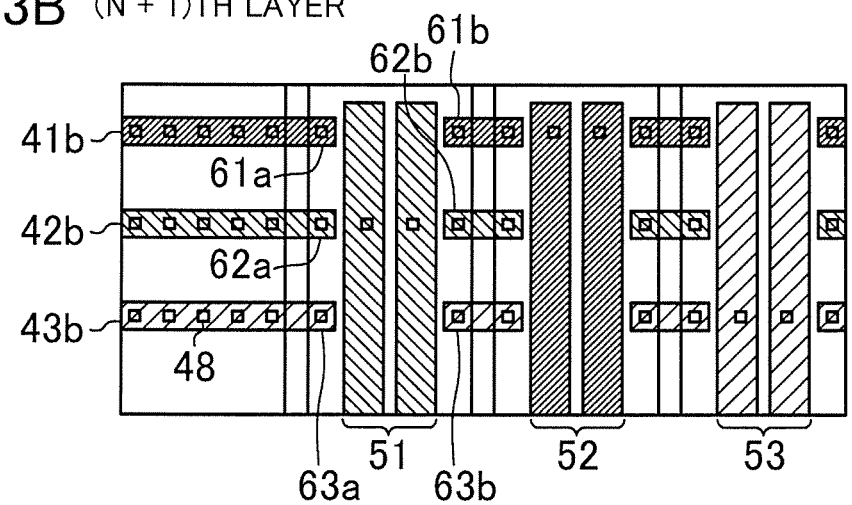
FIG. 3C (N+2)TH LAYER
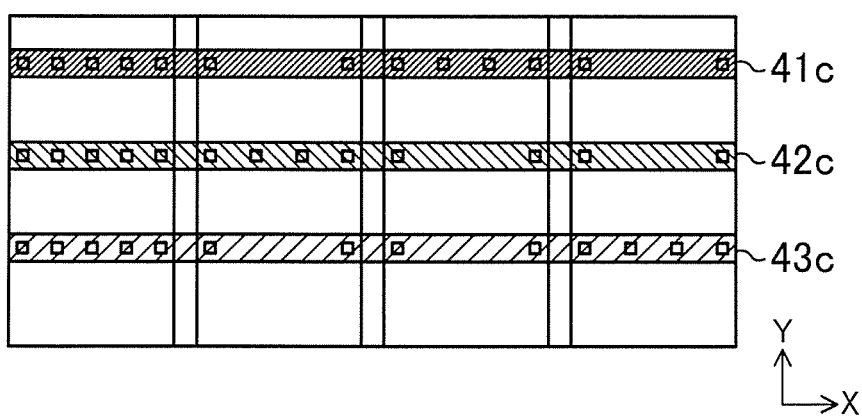

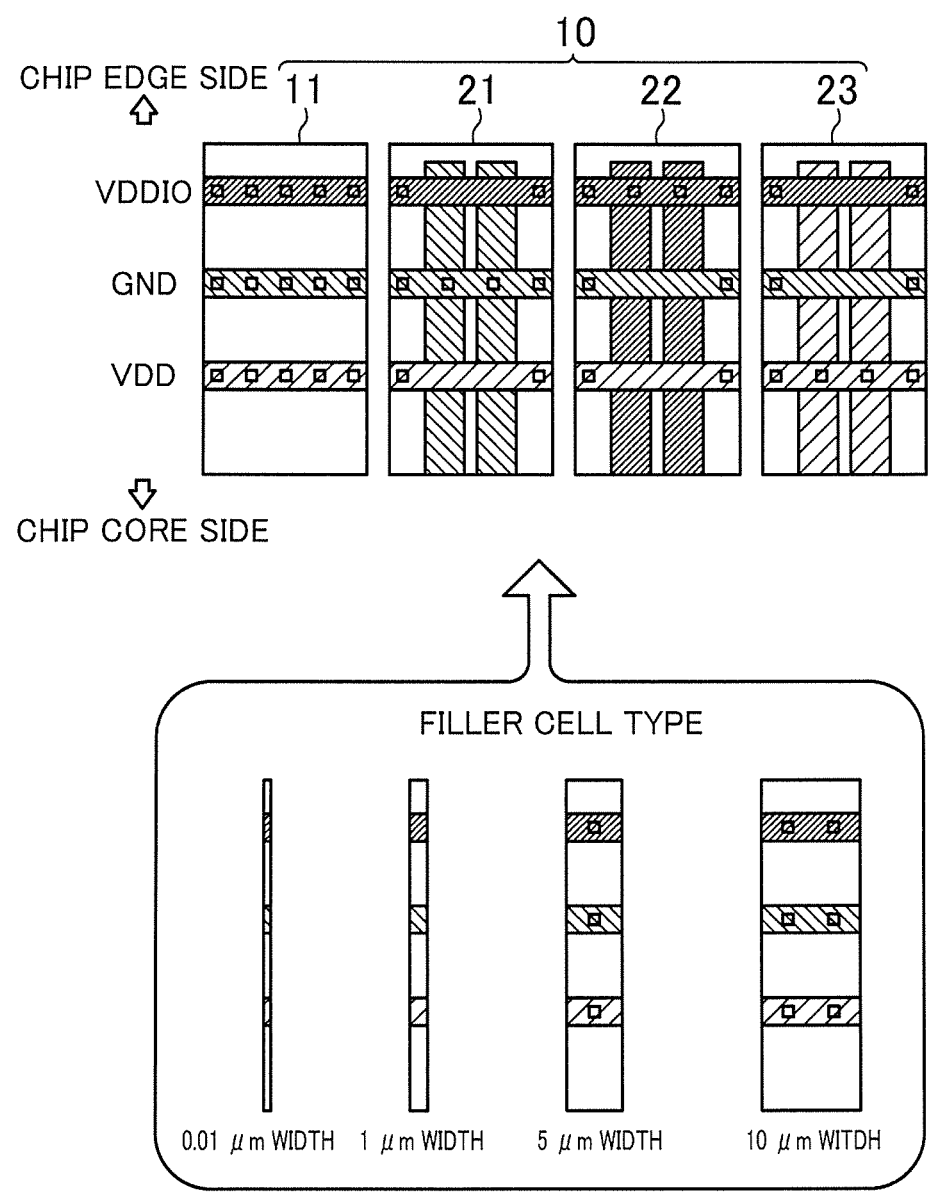

FIG.5A  NTH LAYER
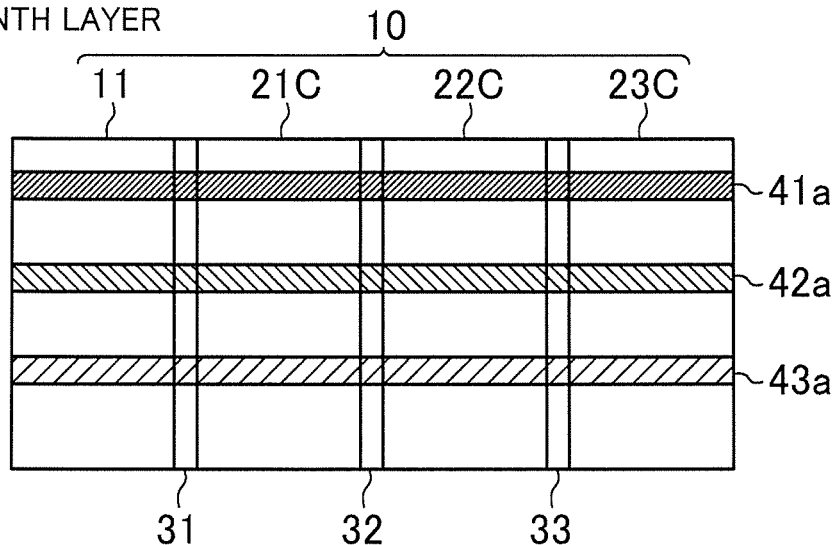
FIG.5B  (N + 1)TH LAYER
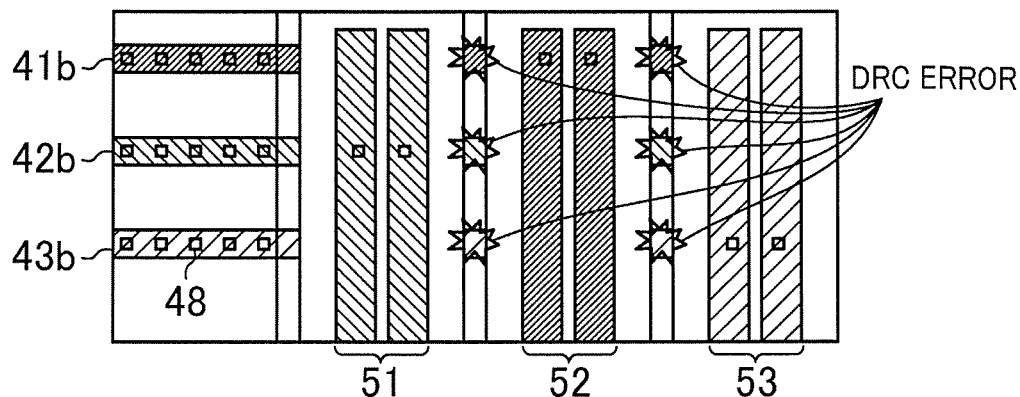
FIG.5C  (N + 2)TH LAYER
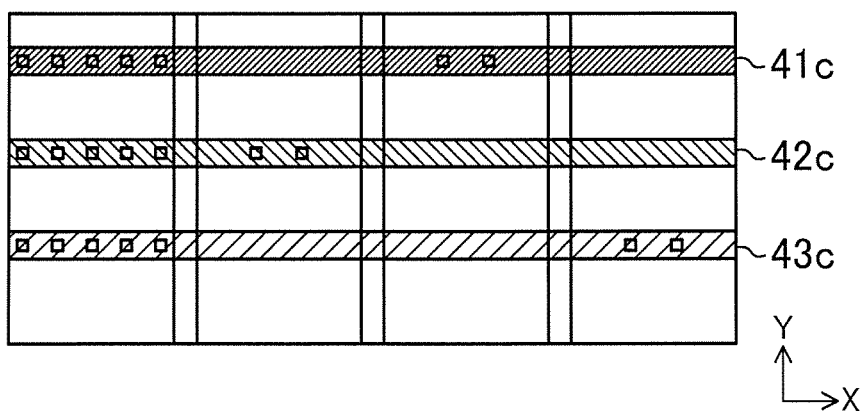

FIG.6A NTH LAYER
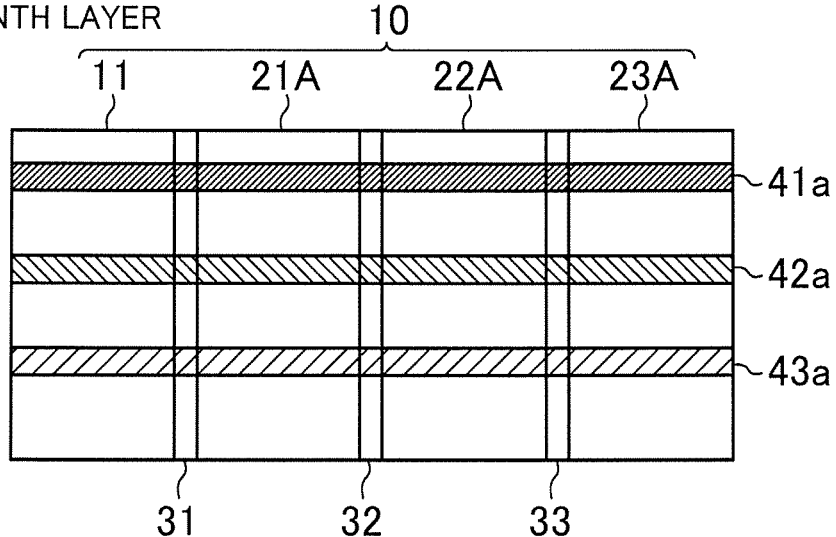
FIG.6B (N+1)TH LAYER
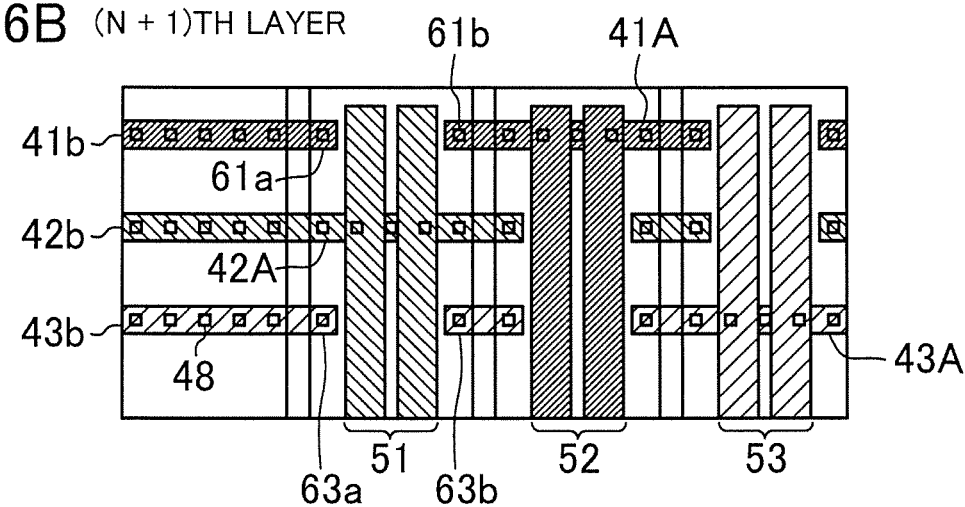
FIG.6C (N+2)TH LAYER
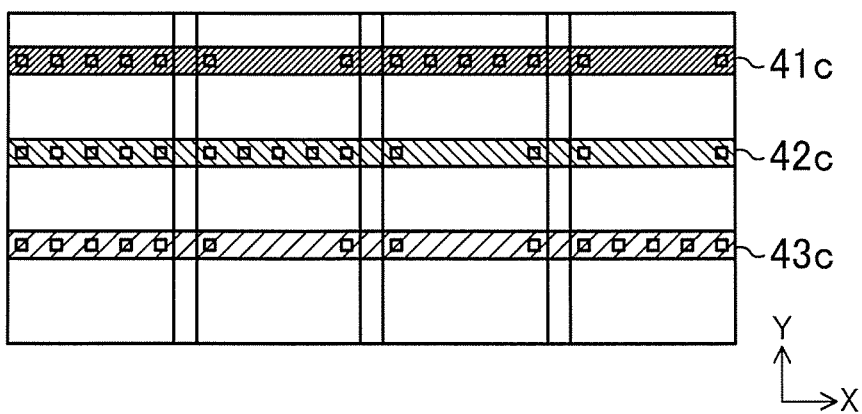

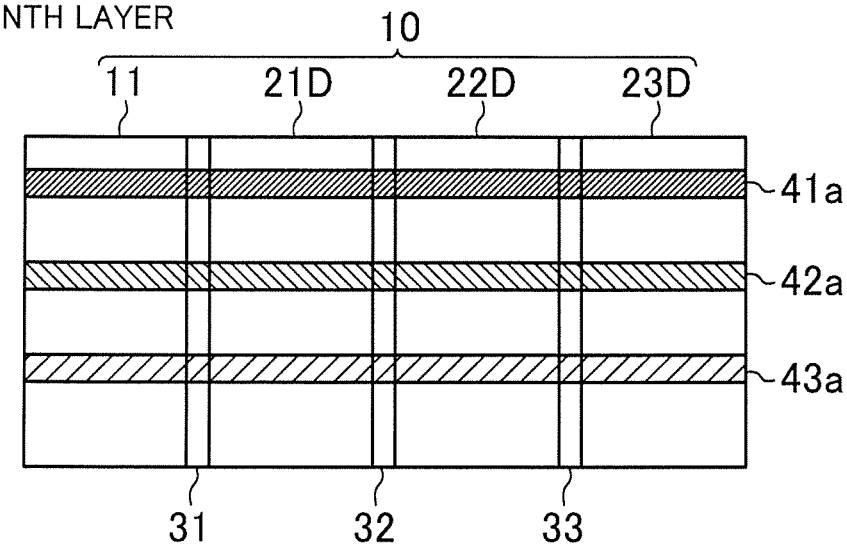
FIG.7A NTH LAYER
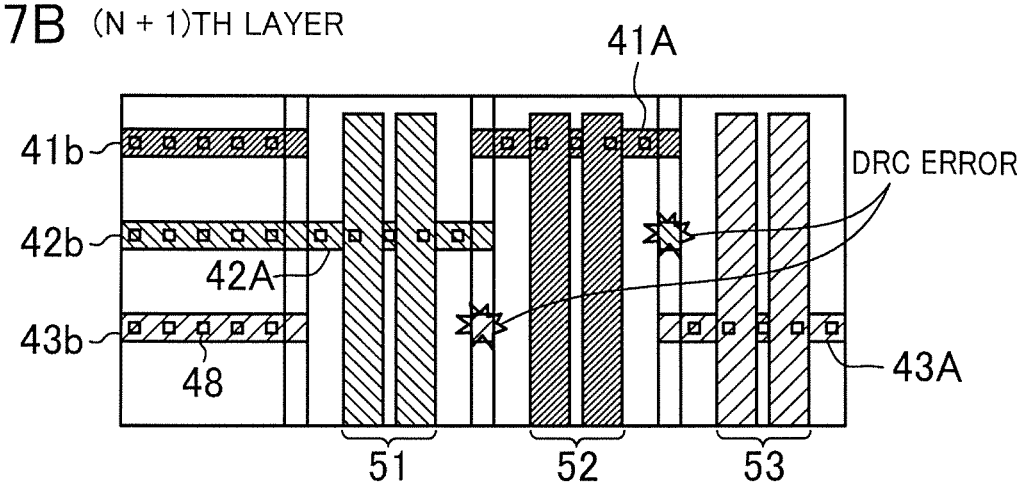
FIG.7B (N + 1)TH LAYER
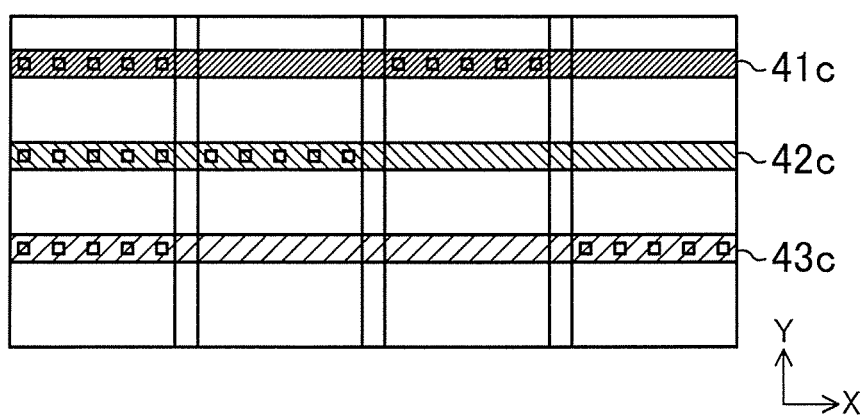
FIG.7C (N + 2)TH LAYER FIG.8
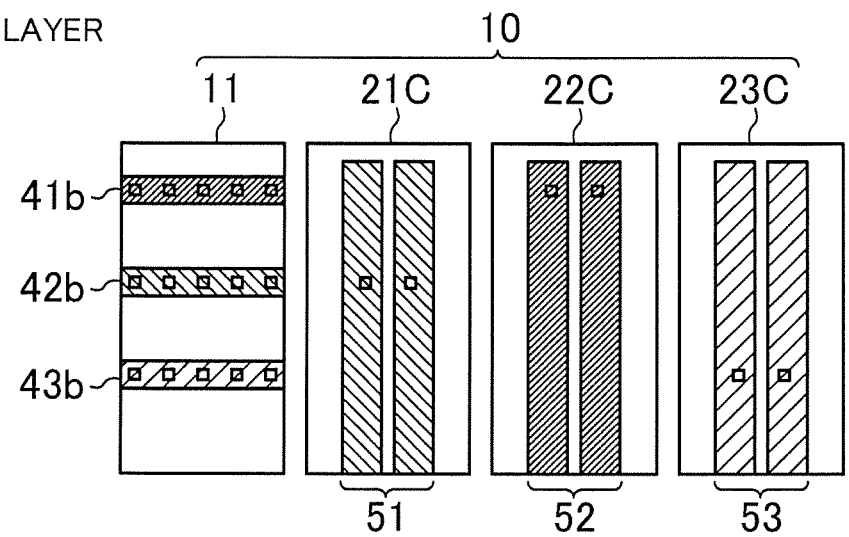
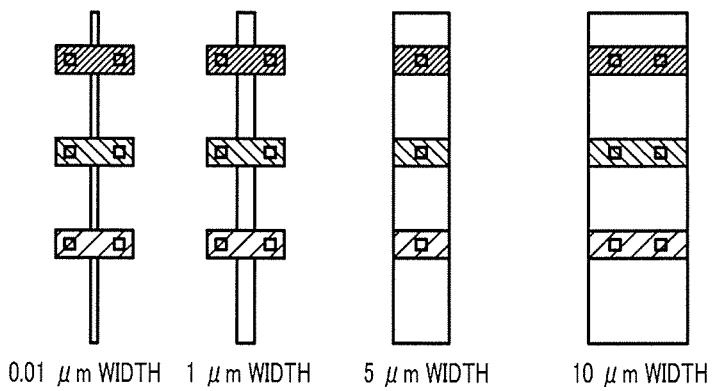

SEMICONDUCTOR INTEGRATED CIRCUIT DEVICE

CROSS-REFERENCE TO RELATED APPLICATIONS

This is a continuation of International Application No. PCT/JP2018/005924 filed on Feb. 20, 2018, which claims priority to Japanese Patent Application No. 2017-064568 filed on Mar. 29, 2017. The entire disclosures of these applications are incorporated by reference herein.

BACKGROUND

The present disclosure relates to a semiconductor integrated circuit device in which an input/output cell (an IO cell) related to interfacing with outside is disposed.

In semiconductor integrated circuits, because of reduction in voltage resulting from miniaturization, reduction of power supply voltage drop in a circuit is more highly required. On the other hand, in semiconductor integrated circuits, power consumption and resistance of interconnect have been increased due to high integration. Therefore, it is more and more difficult to supply power supplied from outside to an internal circuit with a low resistance to reduce power supply voltage drop.

In Japanese Unexamined Patent Publication No. 2009-26868, a technology in which power supply voltage drop is reduced by connecting a ring power supply interconnect in an IO cell to a power supply interconnect in a semiconductor chip in a filler cell disposed in an IO region is described.

SUMMARY

Currently, in semiconductor integrated circuits, as miniaturization has been advanced, multilayering of an interconnect layer has been promoted. However, in Japanese Unexamined Patent Publication No. 2009-26868, a technology in which power supply voltage drop is reduced effectively using a multilayered interconnect is not discussed at all.

It is an object of the present disclosure to provide a configuration in which power supply voltage drop can be reduced using a multilayered interconnect for a semiconductor integrated circuit device in which an IO cell is disposed.

In one embodiment of the present disclosure, a semiconductor integrated circuit device includes an IO cell row including a plurality of IO cells aligned in a first direction and a first power supply interconnect that is formed in a plurality of interconnect layers so as to extend in the first direction in an area of the IO cell row and supplies a first power supply voltage and, in the semiconductor integrated circuit, the plurality of IO cells includes a signal IO cell that performs input, output, or input and output of a signal and a power supply IO cell that supplies a second power supply voltage, the first power supply interconnect is formed in an area of the signal IO cell but not in an area of the power supply IO cell in a first layer that is one of the plurality of interconnect layers, in the first layer in the area of the power supply IO cell, a second power supply interconnect that supplies the second power supply voltage is disposed so as to extend in a second direction perpendicular to the first direction, and an interconnect piece is disposed in a same position as a position of the first power supply interconnect formed in the area of the signal IO cell in the second direction at each of both ends of the area of the power supply IO cell in the first direction.

According to the embodiment, the first power supply interconnect that supplies the first power supply voltage extends in the first direction that is the same direction as the direction in which the IO cells are aligned in the area of the IO cell row. The first power supply interconnect is formed in the plurality of interconnect layers. Thus, resistances of the power supply interconnects can be reduced and power supply voltage drop can be reduced. Also, in the area of the power supply IO cell, the second power supply interconnect that extends in the second direction perpendicular to the first direction in the first layer that is an interconnect in which the first power supply interconnect is not formed and supplies the second power supply voltage is disposed. Accordingly, power can be supplied from external connection pads to a core region, and therefore, power supply voltage drop can be reduced. Furthermore, in the first layer in the area of the power supply IO cell, the interconnect piece is disposed in the same position as the first power supply interconnect formed in the area of the signal IO cell in the second direction at each of both sides in the first direction. Thus, the occurrence of an interconnect design rule error can be avoided between the power supply IO cells.

In a semiconductor integrated circuit device according to the present disclosure, power supply voltage drop can be reduced using a multilayer interconnect. Also, the occurrence of an interconnect design rule error can be avoided.

BRIEF DESCRIPTION OF THE DRAWINGS

FIGS. 3A to 3C are plan views illustrating the configuration example of FIG. 2 for each interconnect layer.

FIG. 4 is a diagram illustrating a design method of the configuration example of FIG. 2.

FIGS. 5A to 5C are plan views illustrating a comparative example of the configuration of FIG. 2.

FIGS. 6A to 6C are plan views illustrating a configuration example of an IO region in a second embodiment.

FIGS. 7A to 7C are views illustrating a comparative example of the configuration of FIGS. 6A to 6C.

FIG. 8 is a diagram illustrating another design method.

DETAILED DESCRIPTION

Embodiments will be described below with reference to the accompanying drawings.

First Embodiment

Figure 1:
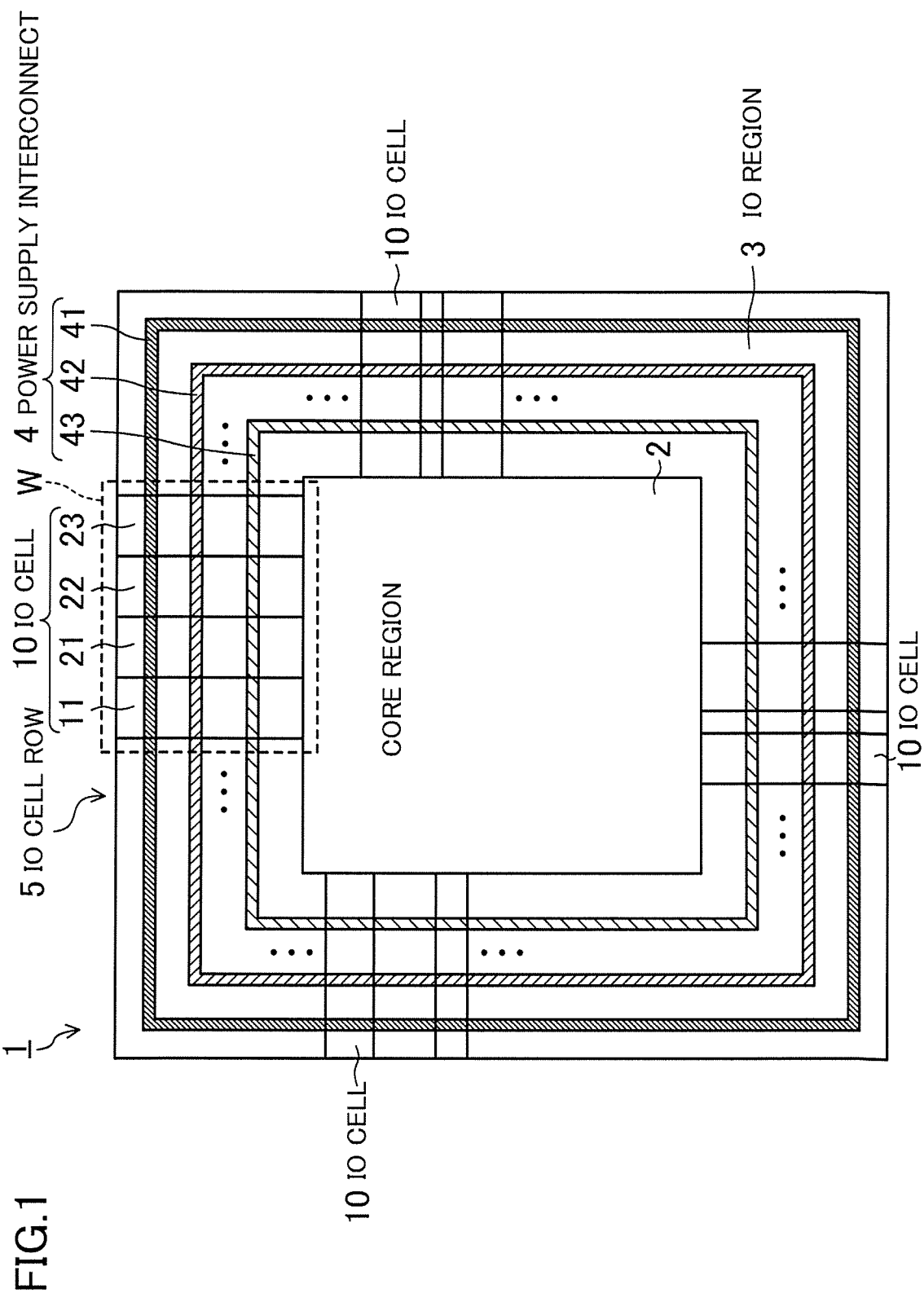
FIG. 1 is a plan view schematically illustrating an entire configuration of a semiconductor integrated circuit device according to an embodiment.

FIG. 1 is a plan view schematically illustrating an entire configuration of a semiconductor integrated circuit device (a semiconductor chip) according to an embodiment. A semiconductor integrated circuit device 1 illustrated in FIG. 1 includes a core region 2 in which an internal core circuit is formed and an IO region 3 which is provided around the core region 2 and in which an interface circuit (an IO circuit) is formed. In the IO region 3, an IO cell row 5 is provided so as to surround a peripheral portion of the semiconductor integrated circuit device 1. Although illustration is simplified in FIG. 1, in the IO cell row 5, a plurality of IO cells 10 forming an interface circuit is aligned.

Herein, the IO cells 10 include a signal IO cell 11 that performs input, output, or input and output of a signal, a GNDIO cell 21 used for supplying a ground potential (a power supply voltage GND), an IO power supply IO cell 22 used for supplying power (a power supply voltage VDDIO) mainly to the IO region 3, and a core power supply IO cell 23 used for supplying power (a power supply voltage VDD) mainly to the core region 2. VDDIO is higher than VDD and, for example, VDDIO is 3.3 V and VDD is 1.0 V. Herein, the GNDIO cell, the IO power supply IO cell, and the core power sully IO cell are collectively referred to as a power supply IO cell as appropriate.

In the IO region 3, a power supply interconnect 4 extending in a direction in which the IO cells 10 are aligned is provided. Herein, the power supply interconnect 4 includes a power supply interconnect 41 that supplies VDDIO, a power supply interconnect 42 that supplies GND, and a power supply interconnect 43 that supplies VDD. Also, in FIG. 1, although not illustrated, a plurality of external connection pads is disposed in the semiconductor integrated circuit device 1.

Figure 2:
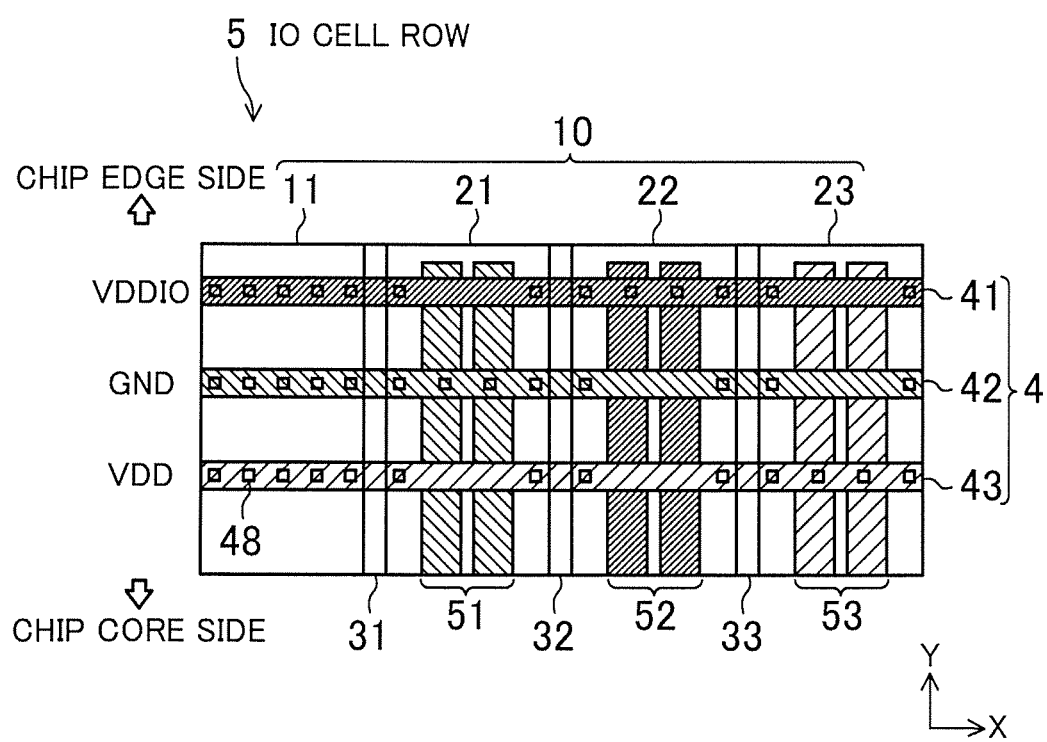
FIG. 2 is a plan view illustrating a configuration example of an IO region in a first embodiment.

FIG. 2 is a plan view illustrating a configuration example of the IO region 3 of the semiconductor integrated circuit device 1 according to this embodiment and corresponds to an enlarged view of a portion W of FIG. 1. Also, FIG. 3 is a plan view illustrating the configuration of FIG. 2 for each interconnect layer in which the power supply interconnect 4 is formed. Note that, in FIG. 2 and FIG. 3, illustration of an internal configuration, a signal interconnect, or the like of the IO cell 10 is omitted. The same applies to plan views in the following description.

In FIG. 2, the IO cell row 5 includes the plurality of IO cells 10 aligned in an X direction (a lateral direction in FIG. 2, which is a direction along an outer side of the semiconductor integrated circuit device 1 and corresponds to a first direction), that is, specifically, a signal IO cell 11, and the GNDIO cell 21, the IO power supply IO cell 22, and the core power supply cell 23 that are power supply cells. In this case, heights of the IO cells 10, that is, sizes of the IO cells 10 in a Y direction (a longitudinal direction in FIG. 2 which corresponds to a second direction perpendicular to the first direction), are all the same. Also, filler cells 31, 32, and 33 used for filling gaps therebetween are disposed between the IO cells 10. In an area of the IO cell row 5, the plurality of power supply interconnects 4, that is, specifically, the power supply interconnect 41 that supplies VDDIO, the power supply interconnect 42 that supplies GND, and the power supply interconnect 43 that supplies VDD, which extend in the X directions is provided.

The signal IO cell 11 includes a circuit, such as, for example, a level shifter, an output buffer circuit, an ESD circuit, or the like, which is necessary for communicating a signal with an external device of the semiconductor integrated circuit device 1 or with the core region 2. Power is supplied to these circuits from the power supply interconnect 4. The GNDIO cell 21, the IO power supply IO cell 22, and the core power supply IO cell 23 supply each power that is supplied to the external connection pads to inside of the semiconductor integrated circuit device 1 and include an ESD circuit or the like.

In FIGS. 3A to 3C, the power supply interconnect 4 is formed in three interconnect layers (the Nth layer, the (N+1)th layer, and the (N+2)th layer). N is an integer of 1 or more and, for example, assuming N=4, the power supply interconnect 4 is formed in the fourth to sixth layers. As illustrated in FIGS. 3A to 3C, in an area of the signal IO cell 11, the power supply interconnect 4 is formed in each of the three interconnect layers and respective interconnects of the three layers are connected via a contact 48. That is, the power supply interconnect 41 includes an interconnect 41a of the Nth layer, an interconnect 41b of the (N+1)th layer, and an interconnect 41c of the (N+2)th layer. Similarly, the power supply interconnect 42 includes an interconnect 42a of the Nth layer, an interconnect 42b of the (N+1)th layer, and an interconnect 42c of the (N+2)th layer. The power supply interconnect 43 includes an interconnect 43a of the Nth layer, an interconnect 43b of the (N+1)th layer, and an interconnect 43c of the (N+2)th layer. Also in areas of the filler cells 31, 32, and 33, the power supply interconnect 4 is formed in the three interconnect layers. Note that the contact 48 illustrated in FIGS. 3A to 3C connects the corresponding interconnect to an interconnect of a lower layer thereunder.

On the other hand, in the area of the power supply IO cell, the power supply interconnect 4 extending in the X direction is not formed in the (N+1)th layer and is formed only in the Nth layer and the (N+2)th layer. In the area of the power supply IO cell, power supply interconnects extending in the Y direction are provided in the (N+1)th layer. Specifically, in the (N+1)th layer, a power supply interconnect 51 that extends in the Y direction and supplies GND is provided in the GNDIO cell 21, a power supply interconnect 52 that extends in the Y direction and supplies VDDIO is provided in the IO power supply IO cell 22, and a power supply interconnect 53 that extends in the Y direction and supplies VDD is provided in the core power supply IO cell 23. The power supply interconnect 51 is connected to the interconnects 42a and 42c that form the power supply interconnect 42 that supplies GND via the contact 48. The power supply interconnect 52 is connected to the interconnects 41a and 41c that form the power supply interconnect 41 that supplies VDDIO via the contact 48. The power supply interconnect 53 is connected to the interconnects 43a and 43c that form the power supply interconnect 43 that supplies VDD via the contact 48.

Furthermore, in the (N+1)th layer, an interconnect piece is formed in the same position as a disposition position of the power supply interconnect 4 in the Y direction at each of both ends of the area of the power IO cell in the X direction. Specifically, for example, each of interconnect pieces 61a and 61b is formed in the same position as the disposition position of the power supply interconnect 41 in the Y direction at each of both ends of the area of the GNDIO cell 21 in the X direction. The interconnect pieces 61a and 61b are connected to the interconnects 41a and 41c that form the power supply interconnect 41 via the corresponding contacts 48. Also, each of interconnect pieces 62a and 62b is formed in the same position as the disposition position of the power supply interconnect 42 in the Y direction at each of both ends of the area of the GNDIO cell 21 in the X direction. The interconnect pieces 62a and 62b are connected to the interconnects 42a and 42c that form the power supply interconnect 42 via the corresponding contacts 48. Also, each of interconnect pieces 63a and 63b is formed in the same position as the disposition position of the power supply interconnect 43 in the Y direction at each of both ends of the area of the GNDIO cell 21 in the X direction. The interconnect pieces 63a and 63b are connected to the interconnects 43a and 43c that form the power supply interconnect 43 via the corresponding contacts 48. Although detailed description is omitted, similar to the area of the GNDIO cell 21, each of interconnect pieces is also formed in the same position as the disposition position of the power supply interconnect 4 in the Y direction at each of both ends of each of the areas of the IO power supply IO cell 22 and the core power supply IO cell 23 in the X direction.

Designing of the IO cell row 5 illustrated in FIGS. 2A to 2C and FIGS. 3A to 3C is performed, for example, in the following manner. As illustrated in FIG. 4, as filler cells, a plurality of cell types having different cell widths is prepared. In this case, cell types having cell widths of 0.01 μm, 1 μm, 5 μm, and 10 μm are prepared. Then, in a design process of the IO cell row 5, the IO cells 10 of various types are disposed in desired positions. At this time, the IO cells 10 are disposed such that gaps between the IO cells 10 are filled with the filler cells. For example, a smallest cell width of the filler cells is 0.01 μm, and therefore, disposition of the IO cells 10 in the X direction is performed by placing the IO cells 10 on grids with intervals of 0.01 μm. Then, after the IO cells 10 are disposed, filler cells are disposed so as to fill the gaps. For example, for a gap of k μm (k is an integer of 1 or more), k filler cells each having a cell width of 1 μm may be disposed.

With the above described configuration, the following effects can be achieved. The power supply interconnect 4 extending in the X direction is formed of a multilayer interconnect in the area of the IO cell row 5, and therefore, a resistance of the power supply interconnect 4 can be reduced to be low and power supply voltage drop can be reduced. Also, power supply to the core region 2 from the external connection pads can be performed by the power supply interconnects 51, 52, and 53 that are provided in the power supply IO cells 21, 22, and 23 so as to extend in the Y direction, and therefore, power supply voltage drop can be reduced.

Also, in this embodiment, in the (N+1)th layer, each of the interconnect pieces 61a, 61b, 62a, 62b, 63a, and 63b is formed in the same position as the corresponding disposition position of the power supply interconnect 4 in the Y direction at each of both ends of the area of the GNDIO cell 21 in the X direction. Similarly, each of interconnect pieces is formed in the same position as the corresponding disposition position of the power supply interconnect 4 in the Y direction at each of both ends of each of the areas of the IO power supply IO cell 22 and the core power supply IO cell 23 in the X direction. Thus, in the filler cells disposed between the power supply IO cells, the occurrence of an interconnect design rule error (a DRC error) can be avoided.

FIGS. 5A to 5C are plan views illustrating a comparison example of the configuration of FIGS. 2A to 2C and FIGS. 3A to 3C. A configuration of FIGS. 5A to 5C is substantially similar to the configuration of FIGS. 3A to 3C. However, FIGS. 5A to 5C is different from FIGS. 3A to 3C in a point that interconnect pieces are not formed in both ends of each of areas of power supply IO cells, that is, the GNDIO cell 21C, the IO power supply IO cell 22C, and the core power supply IO cell 23C in the X direction. In the configuration of FIGS. 5A to 5C, in the (N+1)th layer, interconnects in the filler cell 32 inserted between the GNDIO cell 21C and the IO power supply IO cell 22C and the filler cell 33 inserted between the IO power supply IO cell 22C and the core power supply IO cell 23C in the X direction are independent from the other interconnects. In this case, when the cell width of the filler cells is very small, for the interconnects extending in the X direction, a design rule error, such as, for example, a smallest line width rule error or a smallest area rule error, occurs. Of course, when the cell width of the filler cells is made large enough, the design rule error does not occur but, in this case, an area of an IO cell row is increased, and the degree of freedom of disposition of the IO cells 10 is reduced. According to this embodiment, these problems can be avoided.

Second Embodiment

FIGS. 6A to 6C are plan views illustrating a configuration example of the IO region 3 of the semiconductor integrated circuit device 1 according to a second embodiment and correspond to enlarged views of the portion W of FIG. 1. Note that, similar to FIGS. 3A to 3C, FIGS. 6A to 6C illustrate the configuration example for each interconnect layer in which the power supply interconnect 4 is formed.

A configuration of FIGS. 6A to 6C is substantially similar to the configuration of FIGS. 3A to 3C. The configuration of FIGS. 6A to 6C is different from that of FIGS. 3A to 3C in a point that, in the (N+1)th layer, in an area of a power supply IO cell, a power supply interconnect which supplies the same power supply voltage as a power supply voltage supplied by the power supply IO cell among the power supply interconnects 41, 42, and 43 extending in the X direction. The formed power supply interconnect is connected to a power supply interconnect extending in the Y direction. Specifically, for example, in an area of the GNDIO cell 21A, an interconnect 42A of the power supply interconnect 42 is formed and is connected to the power supply interconnect 51 extending in the Y direction. The interconnect 42A is connected to the interconnects 42a and 42c of the power supply interconnect 42 via the contact 48. Also, in an area of the IO power supply IO cell 22A, the interconnect 41A of the power supply interconnect 41 is formed and is connected to the power supply interconnect 52 extending in the Y direction. The interconnect 41A is connected to the interconnects 41a and 41c of the power supply interconnect 41 via the contact 48. Also, in an area of a core power supply IO cell 23A, an interconnect 43A of the power supply interconnect 43 is formed and is connected to the power supply interconnect 53 extending in the Y direction. The interconnect 43A is connected to the interconnects 43a and 43c of the power supply interconnect 43 via the contact 48.

According to this embodiment, similar effects to those of the first embodiment can be achieved. That is, the power supply interconnect 4 extending in the X direction in the area of the IO cell row 5 is formed of a multilayer interconnect, and therefore, the resistance of the power supply interconnect 4 can be reduced to be low and power supply voltage drop can be reduced. Also, power supply to the core region 2 from external connection pads can be performed by the power supply interconnects 51, 52, and 53 that are provided in the power supply IO cells 21A, 22A, and 23A and extend in the Y direction, and therefore, power supply voltage drop can be reduced. Also, in the (N+1)th layer, each of the interconnect pieces 61a, 61b, 63a, and 63b is formed in the same position as the corresponding disposition position of the power supply interconnect 4 in the Y direction at each of both ends of the area of the GNDIO cell 21A in the X direction. Similarly, each of interconnect pieces is also formed in the same position as the corresponding disposition position of the power supply interconnect 4 in the Y direction at each of both ends of the each of the IO power supply IO cell 22A and the core power supply IO cell 23A in X direction. Thus, in the filler cells disposed between the power supply IO cells, the occurrence of an interconnect design rule error can be avoided.

Furthermore, in the (N+1)th layer, in the area of the GNDIO cell 21A, the power supply interconnect 42A extending in the X direction is formed and is connected to the power supply interconnect 51 extending in the Y direction. Similarly, in the area of the IO power supply IO cell 22A, the power supply interconnect 41A extending in the X direction is formed and is connected to the power supply interconnect 52 extending in the Y direction. In the area of the core power supply IO cell 23A, the power supply interconnect 43A extending in the X direction is formed and is connected to the power supply interconnect 53 extending in the Y direction. Thus, the resistance of the power supply interconnect 4 can be further reduced to be lower and power supply voltage drop can be further reduced.

FIGS. 7A to 7C are plan views illustrating a comparative example of the configuration of FIGS. 6A to 6C. A configuration of FIGS. 7A to 7C is substantially similar to the configuration of FIGS. 6A to 6C. However, the configuration of FIGS. 7A to 7C is different from the configuration of FIGS. 6A to 6C in a point that interconnect pieces are not formed at both ends of each of areas of power supply IO cells, that is, a GNDIO cell 21D, an IO power supply IO cell 22D, and a core power supply IO cell 23D, in the X direction. In the configuration of FIGS. 7A to 7C, in the (N+1)th layer, a part of interconnects extending in the X direction of each of the filler cell 32 inserted between the GNDIO cell 21D and the IO power supply IO cell 23D and the filler cell 33 inserted between the IO power supply IO cell 22D and the core power supply IO cell 23D is independent from other interconnects. In this case, when the cell width of the filler cells is very small, for the corresponding interconnects, a design rule error, such as, for example, a smallest line width rule error or a smallest area rule error, occurs. Of course, when the cell width of the filler cells is made large enough, a DRC error does not occur but, in this case, an area of an IO cell row is increased, and the degree of freedom of disposition of the IO cells is reduced. Note that, for an interconnect, among interconnects of the filler cells 32 and 33, which is connected to a corresponding one of the interconnect 42A provided in the GNDIO cell 21D, the interconnect 41A provided in the IO supply IO cell 22D, and the interconnect 43A provided in the core power supply IO cell 23D, the problem of the DRC error has been solved. However, there is still the problem of the DRC error in other interconnects. According to this embodiment, this problem can be avoided.

(Examples of Other Design Methods)

In the above described embodiments, the power supply IO cells that include interconnect pieces formed at both ends in the X direction are employed. The power supply IO cells and the signal IO cells are aligned and the filler cells are disposed between the IO cells, thus designing the IO cell row 5. However, the configuration examples according to the above described embodiments can be realized also by some other design method.

For example, as illustrated in FIG. 8, as a filler cell having a small cell width, a filler cell of a cell type having a longer interconnect than the cell width is prepared. In this case, for cell types having cell widths of 0.01 μm and 1 μm, each filler cell is formed to have an interconnect that is sufficiently longer than the corresponding cell width. A length of the interconnect is set to be a length with which, even when the interconnect is disposed independently from other interconnects, a DRC error does not occur. As the IO cells 10, the signal IO cell 11, and the power supply IO cells 21C, 22C, and 23C in which interconnect pieces are not formed at both ends thereof in the X direction are disposed and the gaps between the IO cells 10 are filled with the filler cells.

By this design method, for example, when filler cells each having a cell width of 1 μm are disposed between the IO cells, each of interconnect pieces is positioned in the same position as the disposition location of the power supply interconnect 4 in the Y direction at each of both ends of the area of the power supply IO cells in the X direction. That is, the configuration of the IO cell row 5 as in each of the above described embodiments can be also realized by the above described design method.

Figure 9:
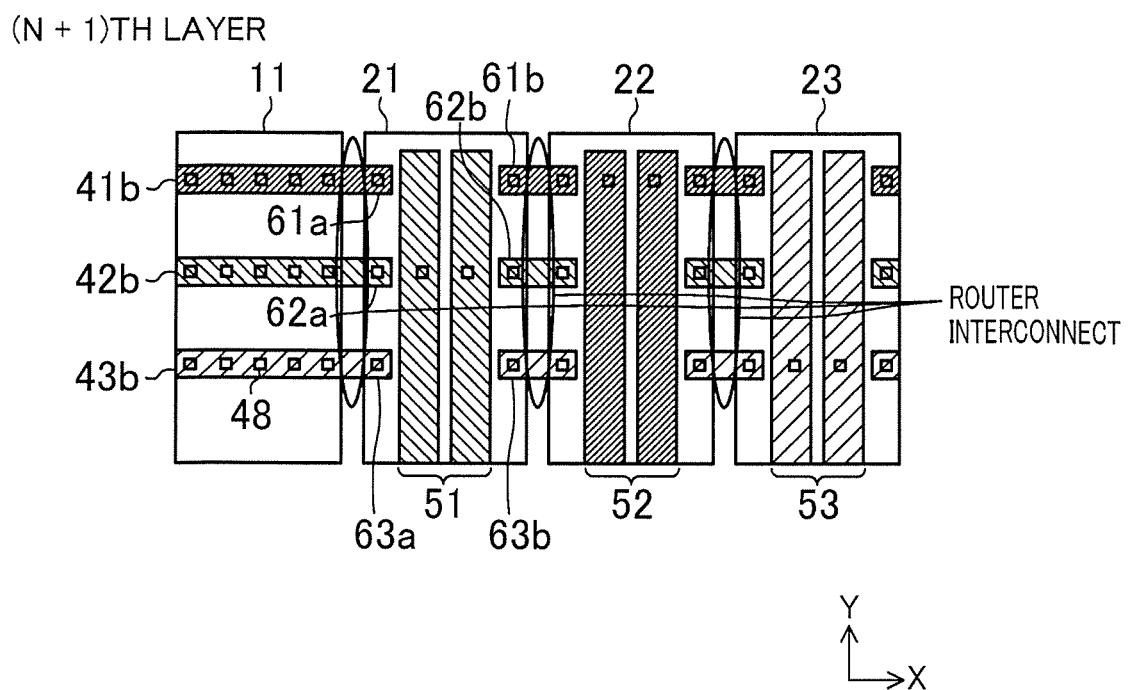
FIG. 9 is a diagram illustrating still another design method.

A design method which does not use filler cells can be is also used. For example, as illustrated in FIG. 9, interconnects may be disposed in areas between the IO cells by a router. In FIG. 9, an interconnect layer of the (N+1)th layer is illustrated. A design method in this case is as follows. First, IO cells (the signal IO cell 11 and the power supply IO cells 21, 22, and 23) of various types are disposed in desired positions. Interconnects are provided by the router in the areas between the IO cells. Specifically, in interconnect layers (the Nth to (N+2)th layers in this case) in which the power supply interconnects 41, 42, and 43 are formed, interconnects extending in the X direction are disposed in positions in which the power supply interconnects 41, 42, and 43 are disposed in the Y direction. Thus, for example, interconnect pieces 61*a*, 61*b*, 62*a*, 62*b*, 63*a*, and 63*b* included in the power supply IO cell 21 are connected to the interconnects provided by the router. If possible, a contact used for connecting each interconnect piece to a corresponding upper layer or lower layer interconnect may be disposed in each interconnect provided by the router.

A similar layout configuration to those of the above described embodiments can be achieved by this method. Also by this method, the gaps between the IO cells are not constrained by the cell width of the filler cells, and therefore, the degree of freedom of disposition of the IO cells is further increased. Also, even when the gaps between the IO cells are very wide, between the IO cells, a power supply interconnect extending in the X direction can be formed in an interconnect layer (the (N+1)th layer in this case) in which a power supply interconnect extending in the Y direction is formed in the power supply IO cell, and therefore, similar to the method using filler cells, the resistance of a ring power supply interconnect formed in the IO cell row can be reduced to be sufficiently low.

Note that, although, in each of the above described embodiments, the IO cell row 5 is provided so as to surround the peripheral portion of the semiconductor integrated circuit device 1, the IO cell row 5 is not limited thereto and may be provided, for example, in a portion of the peripheral portion of the semiconductor integrated circuit device 1. Also, the configuration of this embodiment may not be applied to the entire IO cell row 5 and may be applied at least in a portion of the IO cell row 5.

According to the present disclosure, in a semiconductor integrated circuit device in which IO cells are disposed, power supply voltage drop can be reduced using a multilayer interconnect, and therefore, the present disclosure is useful, for example, for increasing LSI performance.

What is claimed is:
1. A semiconductor integrated circuit device, comprising:
an IO cell row including a plurality of IO cells aligned in a first direction; and
a first power supply interconnect that is formed in a plurality of interconnect layers so as to extend in the first direction in an area of the IO cell row and supplies a first power supply voltage, wherein
- the plurality of IO cells includes a signal IO cell that performs input, output, or input and output of a signal and a power supply IO cell that supplies a second power supply voltage,
- the first power supply interconnect is formed in an area of the signal IO cell but not in an area of the power supply IO cell in a first layer that is one of the plurality of interconnect layers,
- in the first layer in the area of the power supply IO cell,
  - a second power supply interconnect that supplies the second power supply voltage is disposed so as to extend in a second direction perpendicular to the first direction, and
  - an interconnect piece is disposed in a same position as a position of the first power supply interconnect formed in the area of the signal IO cell in the second direction at each of both ends of the area of the power supply IO cell in the first direction.

2. The semiconductor integrated circuit device of claim 1, wherein
- the first power supply interconnect is formed in the area of the power supply IO cell in a second layer of the plurality of interconnect layers, which is different from the first layer, and
- the interconnect piece is connected to the first power supply interconnect formed in the second layer via a contact.

3. The semiconductor integrated circuit device of claim 1, wherein
- the first power supply voltage and the second power supply voltage are a same voltage.

4. The semiconductor integrated circuit device of claim 1, further comprising:
- a third power supply interconnect that is formed in a plurality of interconnect layers so as to extend in the first direction in the area of the IO cell row and supplies the second power supply voltage, wherein
- the third power supply interconnect is formed in the first layer in the area of the signal IO cell and the area of the power supply IO cell, and
- the third power supply interconnect is connected to the second power supply interconnect in the first layer in the area of the power supply IO cell.

* * * * *